US008929116B2

(12) United States Patent  
Arsovski et al.

(10) Patent No.: US 8,929,116 B2  
(45) Date of Patent: Jan. 6, 2015

(54) TWO PHASE SEARCH CONTENT ADDRESSABLE MEMORY WITH POWER-GATED MAIN-SEARCH

(71) Applicant: International Business Machines Corporation, Armonk, NY (US)

(72) Inventors: Igor Arsovski, Williston, VT (US); Michael T. Fragano, Essex Junction, VT (US); Travis R. Hebig, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 13/733,973

(22) Filed: Jan. 4, 2013

(65) Prior Publication Data

US 2014/0192579 A1  Jul. 10, 2014

(51) Int. Cl.
  *G11C 15/00*  (2006.01)
  *G11C 15/04*  (2006.01)

(52) U.S. Cl.
  CPC ............... *G11C 15/04* (2013.01); *G11C 15/00* (2013.01)
  USPC ..................... 365/49.17; 365/49.11; 365/49.1

(58) Field of Classification Search
  CPC .............................. G11C 15/04; G11C 15/00
  USPC ......... 365/49.17, 49.11, 49.1, 189.07, 230.08
  See application file for complete search history.

(56) References Cited

U.S. PATENT DOCUMENTS

| 5,905,668 | A | * | 5/1999 | Takahashi et al. | ............ 365/49.1 |
| 5,995,401 | A | * | 11/1999 | Schultz et al. | ............ 365/49.17 |
| 6,046,923 | A | * | 4/2000 | Evans | ............ 365/49.18 |
| 6,061,262 | A | * | 5/2000 | Schultz et al. | ............ 365/49.16 |
| 6,400,592 | B1 | | 6/2002 | Peterson | |
| 6,584,003 | B1 | | 6/2003 | Kim et al. | |
| 6,671,771 | B2 | | 12/2003 | Perloff | |
| 6,704,216 | B1 | | 3/2004 | Cheng et al. | |
| 7,050,318 | B1 | | 5/2006 | Argyres | |
| 7,158,396 | B2 | | 1/2007 | Hatsch et al. | |
| 7,964,916 | B2 | * | 6/2011 | Or-Bach et al. | ............ 257/347 |
| 8,237,228 | B2 | * | 8/2012 | Or-Bach et al. | ............ 257/369 |
| 8,284,582 | B2 | | 10/2012 | Inoue | |
| 2010/0328982 | A1 | | 12/2010 | Kim et al. | |

OTHER PUBLICATIONS

"Leakage Energy Reduction in Banked Content Addressable Memories" Echeverria, P.; Ayala, J.L.; Lopez-Vallejo, M. Electronics, Circuits and Systems, 2006. ICECS '06. 13th IEEE International Conference on Digital Object Identifier: 10.1109/ICECS.2006.379655 Publication Year: 2006 , pp. 1196-1199.

(Continued)

*Primary Examiner* — Gene Auduong  
(74) *Attorney, Agent, or Firm* — Schmeiser, Olsen & Watts; David Cain

(57) ABSTRACT

Low leakage CAMs and method of searching low leakage CAMs. The method includes performing a pre-search and compare on a small number of pre-search bits with pre-search CAM cells powered to normal voltage levels at all times while the main-search CAM cells are powered to a lower voltage level. Only if a match is detected on the pre-search bits are the main-search CAM cells powered-up to normal voltage levels and the search of the main-search bits activated. The main-search CAM cells are powered to normal voltage levels during read and write operations.

21 Claims, 6 Drawing Sheets

(56) References Cited

OTHER PUBLICATIONS

"Low Power Pre-Comparison Scheme for NOR-Type 10T Content Addressable Memory" Po-Tsang Huang; Wei-Keng Chang; Wei Hwang Circuits and Systems, 2006. APCCAS 2006. IEEE Asia Pacific Conference on Digital Object Identifier: 10.1109/APCCAS. 2006.342422 Publication Year: 2006 , pp. 1301-1304.

Arsovski et al., 1Gsearch/esc Ternary Content Addressable Memory Compiler with Silicon-Aware Early-Predict Late-Correct Single-Ended Sensing, 2012 Symposium on VLSI Circuits Digest of Technical Papers, pp. 116-117.

* cited by examiner

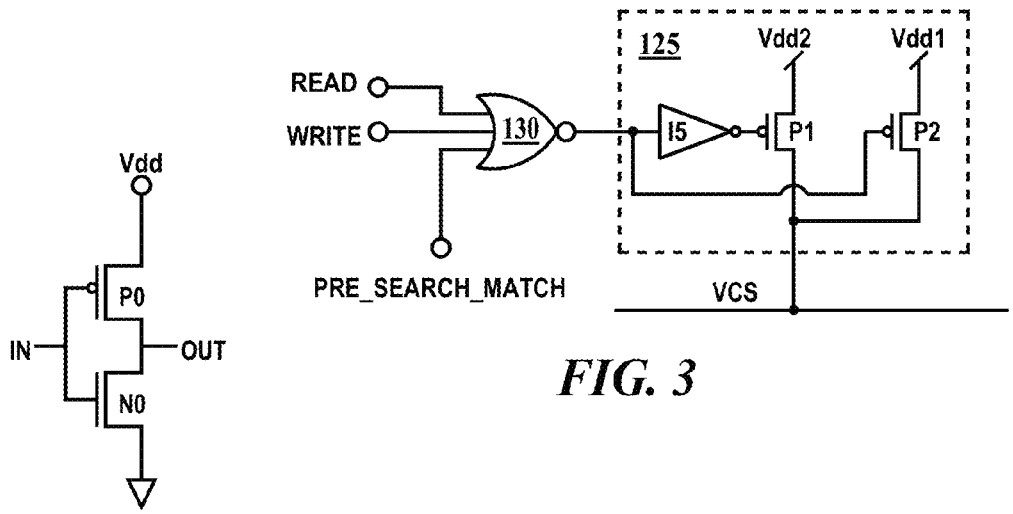
*FIG. 2A*
*FIG. 3*
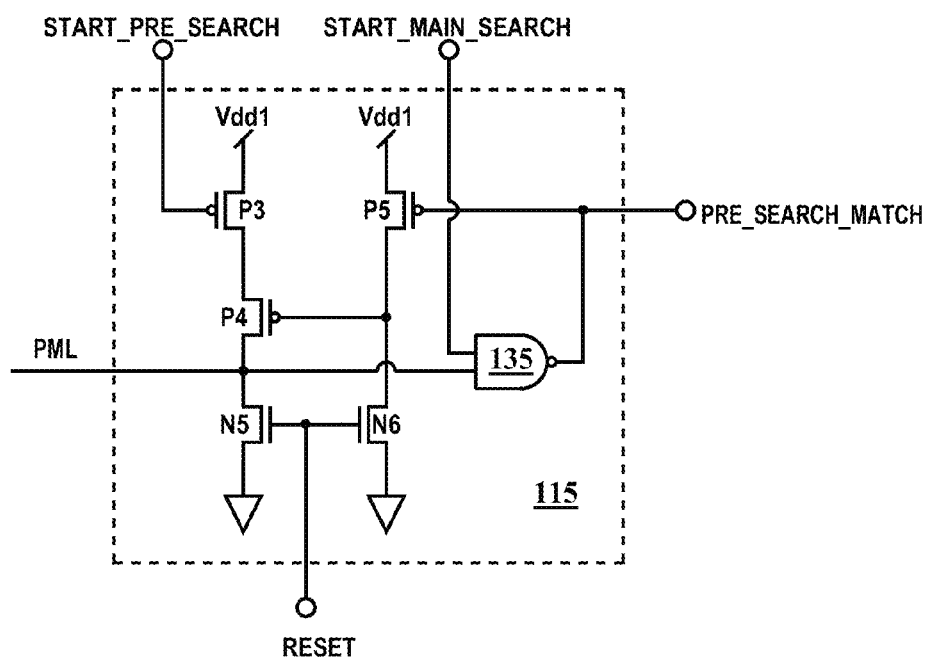
*FIG. 4*

TWO PHASE SEARCH CONTENT ADDRESSABLE MEMORY WITH POWER-GATED MAIN-SEARCH

TECHNICAL FIELD

The present invention relates to the field of integrated circuits; more specifically, it relates to two phase search content addressable memory with power-gated main-search.

BACKGROUND

Content-addressable memories are hardware search engines that are much faster than algorithmic searches. Content-addressable memory cells include a conventional memory cell with additional comparison circuitry. Because content-addressable memory searches the entire memory content they have high power consumption. At the same time leakage current is becoming an increasingly larger component of content-addressable memory power consumption. Accordingly, there exists a need in the art to mitigate the deficiencies and limitations described hereinabove.

BRIEF SUMMARY

A first aspect of the present invention is a content addressable memory, comprising: an array of content addressable memory cells arranged in rows and columns and partitioned into a pre-search section and a main-search section; and each row of content addressable memory cells including: a row of content addressable memory cells of the pre-search section connected between a first positive voltage rail and ground and connected to a pre-matchline of the content addressable memory; a corresponding row of content addressable memory cells of the main-search section connected to a light-sleep circuit, to ground and to a main-matchline of the content addressable memory of the main-search section, the light-sleep circuit configured to connect content addressable memory cells to a second positive voltage rail in a light-sleep state and to connect content addressable memory cells of the corresponding row of content addressable memory cells of the main-search section to the first positive voltage rail in an awake state; a pre-search circuit connected to a pre-search matchline and (i) configured to perform a pre-search of the row of content addressable memory cells of the pre-search section and (ii) configured, only if a match is found, place the light-sleep circuit in the awake state; and a main-search circuit connected to a main matchline and configured to activate a main-search of the row of content addressable memory cells of the main-search section only if a match is found by the corresponding pre-search circuit.

A second aspect of the present invention is a method of searching a content addressable memory, comprising: providing an array of content addressable memory cells arranged in rows and columns and partitioned into a pre-search section and a main-search section; applying a first positive voltage to content addressable memory cells of the pre-search section; applying a second positive voltage to content addressable memory cells of the main-search section, the second voltage lower than the first voltage; applying a search word comprising a set of pre-search bits and main-search bits to the content addressable memory; performing a pre-search of each row of content addressable memory cells of the pre-search section using the set of pre-search bits; only for each row of content addressable memory cells where a match was found as a result of performing the pre-search, de-applying the second voltage and applying the first voltage to the content addressable memory cells of the main-search section and then performing a main-search of those rows of content addressable memory cells of the main-search section using the set of main-search bits; for each row of content addressable memory cells where no match was found as a result of performing the pre-search or as a result of performing the main-search, generating a no-match signal; and for each row of content addressable memory cells where a match was found as a result of performing the pre-search and as a result of performing the main-search, generating a match signal.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIG. 2A is a schematic diagram of an exemplary inverter of a static random access memory cell according to embodiments of the present invention;

FIG. 3 is a schematic diagram of light-sleep power circuit according to embodiments of the present invention;

FIG. 4 is a schematic diagram of a pre-search circuit according to embodiments of the present invention;

DETAILED DESCRIPTION

CAMs according to the embodiments of the present invention perform a pre-search and compare on a small number of pre-search bits (e.g., first 8 bits out of a 128 bit search word) with the pre-search CAM cells powered to normal voltage levels at all times while the main-search CAM cells (e.g., last 120-bits out of the 128 bit search word) are powered to a lower voltage level (light-sleep state). Only if a match is detected on the pre-search bits are the main-search CAM cells powered-up to normal voltage levels (awake state) and the search of the main-search bits activated. The main-search CAM cells are powered to normal voltage levels during read and write operations. For binary CAMs, a match is defined as every bit of the search word (or portion thereof) being the same as the corresponding bit stored in the CAM in the matchline-wise direction. For ternary CAMs, a match is defined as bits stored in the CAM in the matchline-wise direction being the same or a "don't care" bit of a corresponding bit in the search word.

Figure 1:
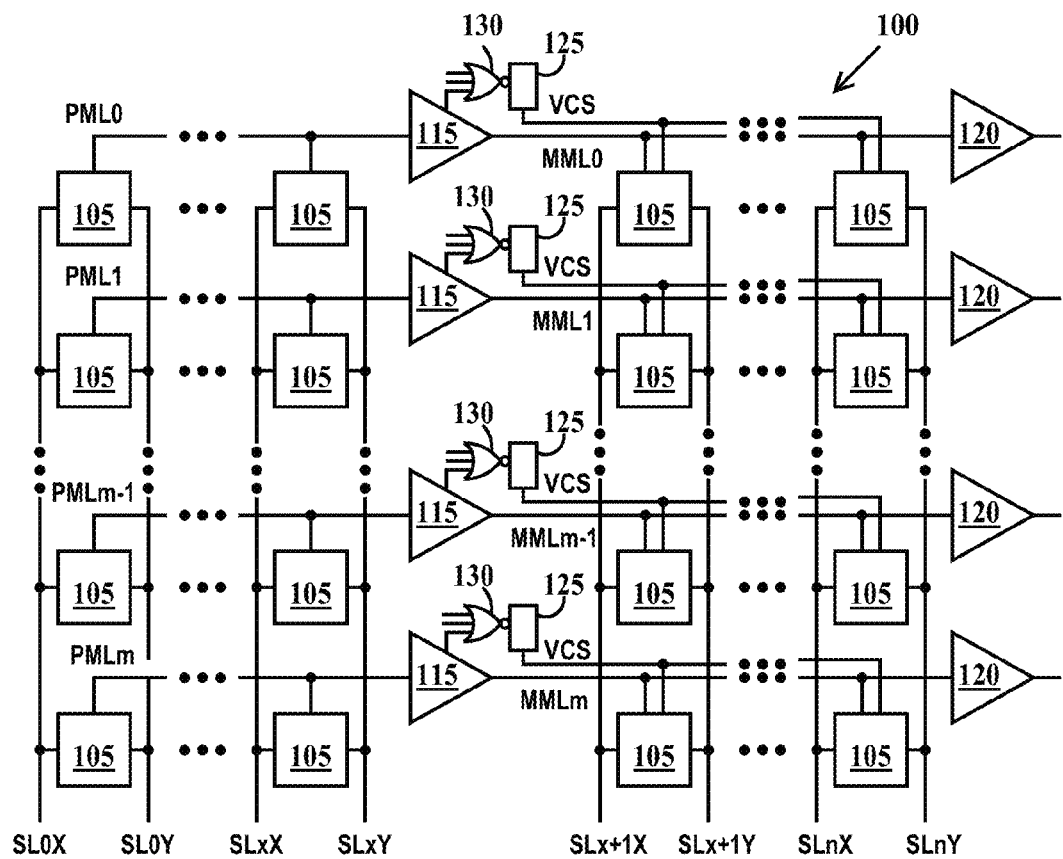
FIG. 1 is a schematic diagram of a content-addressable memory (CAM) according to embodiments of the present invention.
Figure 7:
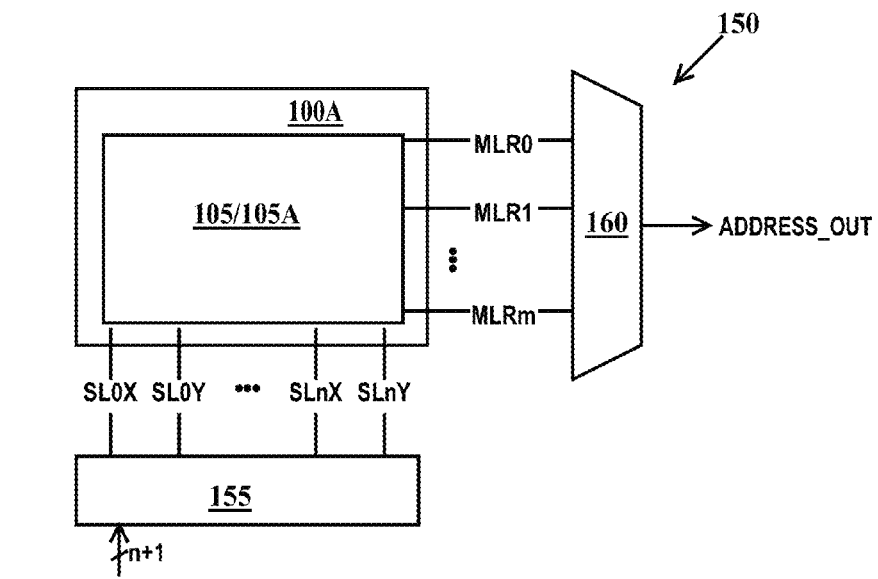
FIG. 7 is a schematic diagram of an exemplary CAM application circuit according to embodiments of the present invention.

FIG. 1 is a schematic diagram of a CAM according to embodiments of the present invention. In FIG. 1, a CAM 100 includes an array of CAM cells 105 arranged in rows and columns. Each CAM cell 105 in each row is connected to a corresponding pre-search matchline (PML) or main-matchline (MML) and each CAM cell 105 is connected to a corresponding pair of search lines (SL). CAM cells connected to pre-matchlines are pre-search CAM cells and CAM cells connected to main-matchlines are main-search CAM cells. There are n search line pairs and m PMLs and corresponding MMLs. The x columns of pre-search CAM cells 105 are connected to respective x pairs of search lines SL0X/SL0Y through SLxX/SLxY and corresponding pre-matchlines PML0 through PMLm. The x+1 through n columns of main-search CAM cells 105 are connected to the respective n-x pairs of SLx+1X/SLx+1Y through SLnX/SLnY and corresponding main matchlines MML0 through MMLm. In one example, if there are 128 CAM cells per row, n=127 (128 total bits), x=7 (eight pre-search bits 0 through 7), and there are n-x (120 main-search bits, 8 through 127). m is a whole positive integer. The wordlines, wordline drivers, bitlines and bitline drivers associated with CAM 100 are not shown for clarity. The wordlines and bitlines are illustrated in FIGS. 2 and 7.

Each pre-matchline PLM0 through PLMm is connected to a respective main matchline MML0 through MMLn by a corresponding pre-search circuit 115. The output of each main-matchline MML0 through MMLm is connected to a respective main-search circuit 120. Each CAM cell 105 of the 0 through x columns of CAM cells is powered by the normal power supply of CAM 100. Each CAM cell 105 of the x+1 through n columns of CAM cells are connected to a light-sleep power circuit 125 by a power rail VCS. Each light-sleep power circuit 125 is connected to and controlled by a respective NOR gate 130 connected to a corresponding pre-search circuit 115. Light-sleep power circuits 125 may apply one of two voltage levels to a power rail VCS. There are separate light-sleep power circuits 125 and NOR gates 130 for each pre-matchline/main matchline pair PLM0/MML0 through PMLm/MMLm.

Initially, pre-search CAM cells 105 are powered by the normal power voltage level (Vdd1) and main-search CAM cells 105 are a in light-sleep state that is powered by power rail VCS at a voltage Vdd2 that is lower then Vdd1. Defining ground (GND) as zero volts, Vdd1 and Vdd2 are positive voltages. Therefore Vdd1>Vdd2>GND. In a first step, the pre-search bits are evaluated by the pre-search CAM cells and only if there is a match on the pre-search bits are the main-search CAM cells switched from light-sleep power to normal power by removing Vdd2 from power rail VCS and applying Vdd1 to power rail VCS and the remaining main-match bits compared in the main-search CAM cells. The light-sleep state saves power because leakage through a field effect transistor (FET) is a function of voltage so there is less current draw by the main-search CAM cells in sleep state. Assuming a 100% search activity factor, with 8 pre-search bits, the main-search CAM cells would be at full power about 0.4% of the time (0.5^8=0.0039) and in light-sleep state about 99.6% of the time.

Figure 2:
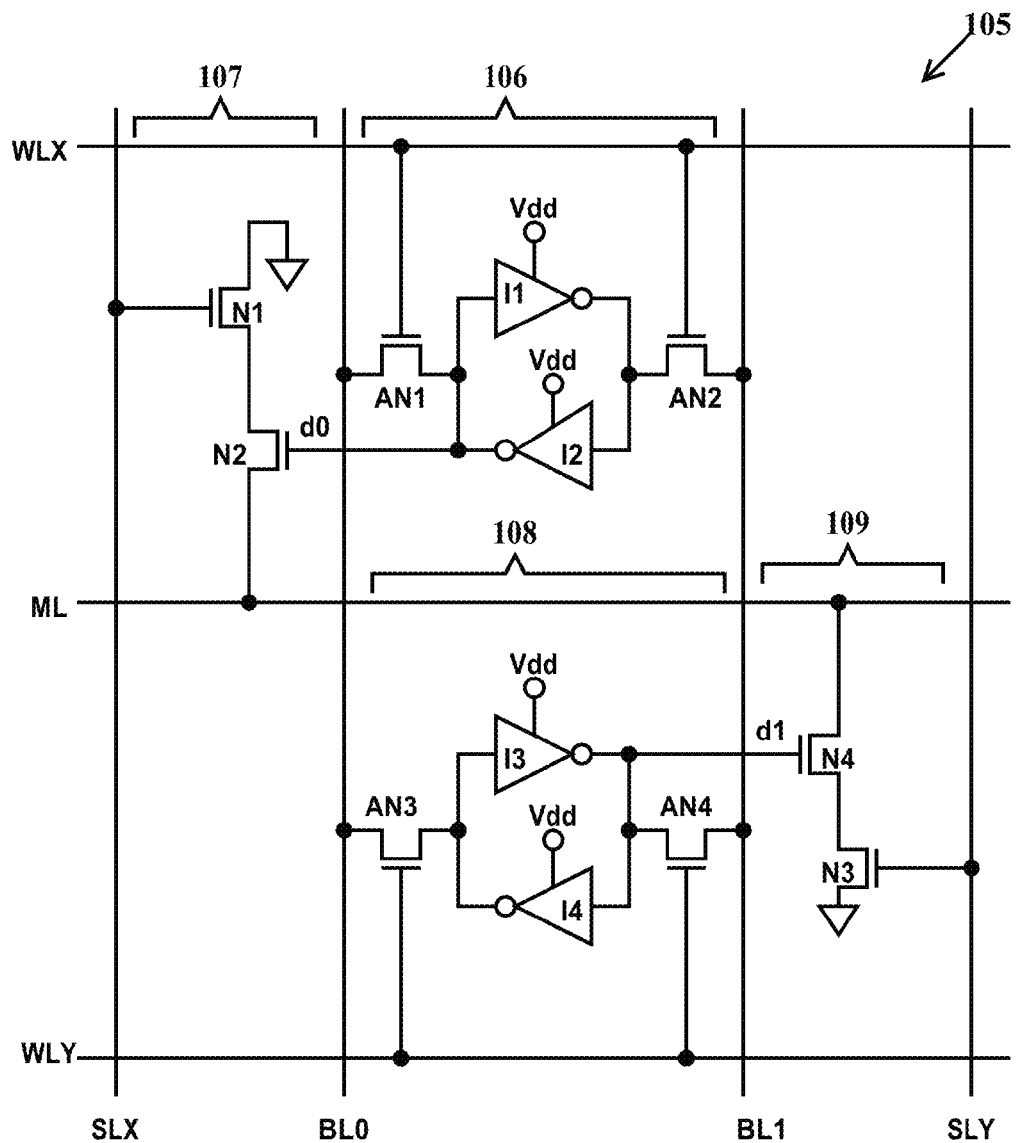
FIG. 2 is a schematic diagram of an exemplary ternary CAM cell according to embodiments of the present invention.

FIG. 2 is a schematic diagram of an exemplary ternary CAM (TCAM) cell according to embodiments of the present invention. In FIG. 1 a TCAM cell 105 includes (i) a first half cell of first static random access memory (SRAM) cell 106 including cross-coupled invertors I1 and I2 and NFETs AN1 and AN2 and a first NOR pull-down stack 107 including NFETs N1 and N2 and (ii) a second half cell of second SRAM cell 108 including cross-coupled invertors I3 and I4 and NFETs AN3 and AN4 and a second NOR pull-down stack 109 including NFETs N3 and N4. There are two wordlines WLX and WLY, a shared matchline ML, a search line pair SLX and SLY and a bitline pair BL0 and BL1.

The source of NFET N1 is connected to ground, the drain of NFET N1 is connected to the source of NFET N2, the drain of NFET N2 is connected to matchline ML, the gate of NFET N1 is connected to search line SLX and the gate of NFET N2 is connected to the input of inverter I1 and the output of inverter I2. The output of inverter I1 is connected to input of inverter I2 and the output of inverter I2 is connected to the input of inverter I1. The source of NFET AN1 is connected to bitline BL0, the drain of NFET AN1 is connected to the input of inverter I1 and output of inverter I2, and the gate of NFET AN1 is connected to WLX. The source of NFET AN2 is connected to bitline BL1, the drain of NFET AN2 is connected to the input of inverter I1 and the output of inverter I2, and the gate of NFET AN2 is connected to WLX.

The source of NFET N3 is connected to ground, the drain of NFET N3 is connected to the source of NFET N4, the drain of NFET N4 is connected to matchline ML, the gate of NFET N3 is connected to search line SLY and the gate of NFET N4 is connected to the input of inverter I1 and the output of inverter I2. The output of inverter I1 is connected to input of inverter I2 and the output of inverter I2 is connected to the input of inverter I1. The source of NFET AN3 is connected to bitline BL0, the drain of NFET AN3 is connected to the input of inverter I1 and output of inverter I2, and the gate of NFET AN3 is connected to WLY. The source of NFET AN4 is connected to bitline BL1, the drain of NFET AN4 is connected to the input of inverter I1 and the output of inverter I2, and the gate of NFET AN4 is connected to WLY.

The Vdd supply to inverters I1, I2, I3 and I4 depends on whether TCAM cell 105 is a pre-search TCAM cell or a main-search TCAM cell. When TCAM cell 105 is a pre-search TCAM cell, matchline ML is a PML and Vdd is the normal operating power supply Vdd1 of the TCAM cell. When TCAM cell 105 is a main-search TCAM cell, matchline ML is a MML and Vdd is VCS supplied by a light-sleep power circuit 125 described supra in reference to FIG. 1 and further described infra with respect to FIG. 3.

Reads of and writes to the SRAM cells occur when the wordlines WLX or WLY are high (logical 1, a voltage above GND) and the bit stored in the SRAM is written to or read from the bitlines through NFETs AN1 and AN2 or AN3 and AN4.

During a search, the wordlines WLX and WLY are held low (logical 0, GND) and NFETs AN1, AN2, AN3 and AN4 are turned off. If there is a 1-bit on SLX, NFET N1 is turned on and if there is a 1-bit stored in first SRAM cell, 106 NFET N2 is turned on and matchline ML is held or pulled to ground. If there is a 0-bit on SLX, NFET N1 is turned off and there is no effect on matchline ML. If there is a 0-bit stored in first SRAM cell 106, NFET N2 is turned off and there is no effect on matchline ML. If there is a 1-bit on SLY, NFET N3 is turned on and if there is a 1-bit stored in first SRAM cell 108 NFET N4 is turned on and matchline ML is held or pulled to ground. If there is a 0-bit on SLY, NFET N3 is turned on and there is no effect on matchline ML. If there is a 0-bit stored in first SRAM cell 108, NFET N4 is turned off and there is no effect on matchline ML. The logic function for TCAM cell 105 is illustrated in Table I.

TABLE I

| SLX | SLY | T |
|---|---|---|
| 0 | 1 | 0 |
| 1 | 0 | 1 |
| 0 | 0 | X | where X is a "don't care" bit and is always a match (that is, has no effect on the matchline). The combination SLX=1 and SLY=1 is not used.

FIG. 2A is a schematic diagram of an exemplary inverter of an SRAM cell according to embodiments of the present invention. In FIG. 2A, the source of a PFET P0 is connected to Vdd, the drain of PFET P0 is connected to the drain of NFET N0 and the source of NFET N0 is connected to ground. When the inverter is an element of a pre-search CAM cell, Vdd is the normal operating power supply of the CAM cell. When the inverter is an element of a main-search CAM cell, Vdd is either Vdd1 or Vdd2 on a power rail VCS supplied by a light-sleep power circuit 125 described supra in reference to FIG. 1 and further described infra with respect to FIG. 3.

FIG. 3 is a schematic diagram of light-sleep power circuit 125 according to embodiments of the present invention. In FIG. 3, light-sleep power circuit 125 includes an inverter I5 and PFETs P1 and P2. The input of inverter I5 (which is the input of circuit 125) is connected to the gate of PFET P2. The output of inverter I5 is connected to the gate of PFET P1. The source of PFET P1 is connected to Vdd2 and the source of PFET P2 is connected to Vdd1. Again Vdd1>Vdd2. The drain of PFET P2 is connected to the drain of PFET P1 which is also the output of circuit 125 which is connected to power rail VCS. The input of circuit 125 (input of inverter I5) is connected to the output of NOR gate 130. A READ signal is connected to a first input of NOR gate 130, a WRITE signal is connected to second input of NOR gate 130, and a PRE_SEARCH_MATCH signal is connected to a third input of NOR gate 130.

The output of NOR gate 130 is low if any of the inputs to NOR gate are high which turns on PFET P1 and turns off PFET P2, so Vdd1 is applied to power rail VCS as the awake state for reading, writing and searching. The output of NOR gate 130 is high if all of the inputs to NOR gate are low which turns off PFET P1 and turns on PFET P2, so Vdd2 is applied to power rail VCS so the light-sleep is the default state. The READ and WRITE signals are used to store data in the CAM cells. The PRE_SEARCH_MATCH signal is generated by pre-search circuit 115 (see FIGS. 1 and 4). Only the invertors of main-search CAM cells are powered by either Vdd1 (wake state) or Vdd2 (light-sleep state). All invertors other than invertors of main-search CAM cells, all logic gates, and all latches are powered by Vdd1 and not by Vdd2. For example, inverter I5 and NOR gate 130 are powered by Vdd1. In one example, when Vdd1 is about 1.0 volts, Vdd2 is about 0.7 volts. Vdd2 must be high enough to allow the latch transistors to maintain the state of the data stored in the cell.

FIG. 4 is a schematic diagram of pre-search circuit 115 according to embodiments of the present invention. In FIG. 4, pre-search circuit 115 includes PFETS P3, P4 and P5, NFETS N5 and N6 and a NAND gate 135. The source of PFETs P3 and P5 are connected to Vdd1, the drain of PFET P3 is connected to the source of PFET P4, drain of PFET P5 is connected the drain of NFET N5, a pre-matchline PML, and a first input of NAND gate 135. The drain of PFET P5 is connected to the drain of NFET N6 and the gate of PFET P4. The sources of NFETs N5 and N6 are connected to GND. The gate of PFET P5 is connected to the output of NAND gate 135 which is also the output of circuit 115, the PRE_SEARCH-MATCH signal. A START_PRE_SEARCH signal is connected to the gate of PFET P3 and a START_MAIN_SEARCH signal is connected to a second input of NAND gate 135. A RESET signal is connected to the gates of NFETs N5 and N6.

RESET high, precharges PML to GND through NFET N5. To start a pre-search, RESET, START_PRE_SEARCH, START_MAIN_SEARCH are set low, NFETs N5 and N6 are off and PFET P3 turns on so PFETs P3 and P4 start to pull up the PML. The voltage level on PML becomes dependent on the number of mismatches in the pre-search CAM cells connected to the PML as the NOR pull-down stacks pulling the PML down in the mismatch CAM cells compete with PFETs P3 and P4 pulling the PML up.

If there are no mismatches on the PLM (PML0), the PML will ramp from GND to Vdd1 through PFETS P3 and P4 and when START_MAIN_SEARCH is asserted high, PFET P5 turns on turning PFET P4 off and PRE_SEARCH_MATCH goes low indicating a match.

If there are many mismatches on the PML (PMLN), the PML will be pulled down by the NOR gate stacks of the mismatch CAM cells. With NOR pull-down stacks pulling down the PML to GND and PRE_SEARCH_MATCH on or off PRE_SEARCH_MATCH will go high indicating a mismatch. With only one CAM cell mismatched (PML1W), the voltage on the PML may be between GND and Vdd1 and may look like a match. However, when START_MAIN_SEARCH goes high PFET P5 turns on, turning off PFET P4, stopping precharge of the PML or PLM0 or PLM1W leaving them floating. For the PLM0 case, the PML will remain charged high. For the PLMW1 case, the PML discharges to low.

Figure 5:
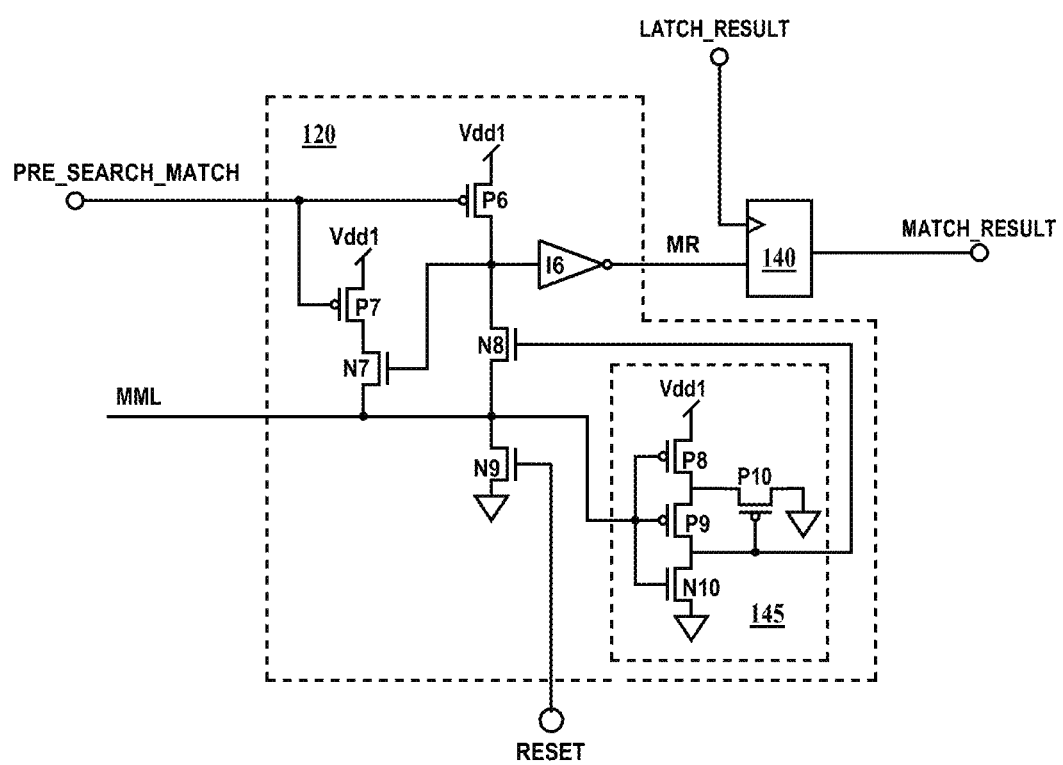
FIG. 5 is a schematic diagram of a main-search circuit according to embodiments of the present invention.

FIG. 5 is a schematic diagram of main-search circuit 120 according to embodiments of the present invention. In FIG. 5, main-search circuit 120 includes PFETs P6, P7, P8, P9 and P10, NFETs N7, N8, N9 and N10 and an inverter I6. The sources of PFETs P6, P7 and P8 are connected to Vdd1 and the sources of NFETs N9 and N10 are connected to GND. The drain of PFET P10 is connected to GND. The drain of PFET P7 is connected to the drain of NFET N7 and the source of NFET N7 is connected to main-matchline MML. The drain of PFET P6 is connected to the drain of NFET N8, the gate of NFET N7 and the input of inverter I6. The source of NFET N7 is connected to MML, to the drain of NFET N9 and to the gates of PFETs P8, P9 and NFET N10. The drain of PFET P8 and the source of PFET P9 are connected to the source of PFET P10. The drain of PFET P9 and the drain of NFET N10 are connected to the gate of NFET N8 and the gate of PFET P10. The PRE_SEARCH_MATCH signal is connected to the gates of PFETS P6 and P7 and the output of inverter I6 is signal MR. PFETs P8 and P9 and NFETs N10 and PFET P10 are configured as a Schmitt-trigger 145. PFET P7 and NFET N7 provide additional current to the MML. RESET signal is connected to the gate of NFET N9 and precharges the MML to GND when asserted high. MATCH_RESULT is stored in latch 140 and captured when signal LATCH_RESULT falls.

If PRE_SEARCH_MATCH is high (no pre-search match) the CAM cells will be left in sleep state (Vdd2 is applied to VCS) and PFETs P6 and P7 will not be turned on so the main-matchline search will not be activated. The MML remains low, the output of the Schmidtt trigger is high, NFET N8 is on, the low on the MML is applied to the input of inverter I6 through NFET N8 and the output of inverter I6 is high, so MATCH_RESULT is high (indicating a mismatch).

RESET is set to low, turning off NFET N9 during a MML search. If PRE_SEARCH_MATCH is low (indicating a pre-search match) the CAM cells will be "awakened" from sleep state and fully powered (Vdd1 is applied to VCS) and PFETs P6 and P7 will be turned on, pulling up MML through P7 and N8, thus activating the main-matchline search.

If there are no mismatches (MML0) on the MML, the MML will ramp from GND to Vdd1, through PFET P6 and NFET N8, the output of Schmidtt trigger 145 will go low, turning NFET N8 off. With PRE_SEARCH_MATCH low, Vdd1 is applied to the input of inverter I6 through PFET P6 so the output of inverter I6 is low, so MATCH_RESULT is low (indicating a match).

If there are multiple mismatches (MMLN) on the MML, the MML will be pulled down by the NOR gate stacks of the mismatch CAM cells. With NOR pull-down stacks pulling down the MML to GND, the output of Schmidtt trigger 145 will be high, NFET N8 remains on, the input to I6 will be low and MR will be high indicating a mismatch. Single mismatches (MML1s) will result in a mismatch the same as MMLNs because MML1s will also drop below the trigger voltage of Schmitt trigger 145, turning on N8 and pulling down the input to I6.

Figure 6:
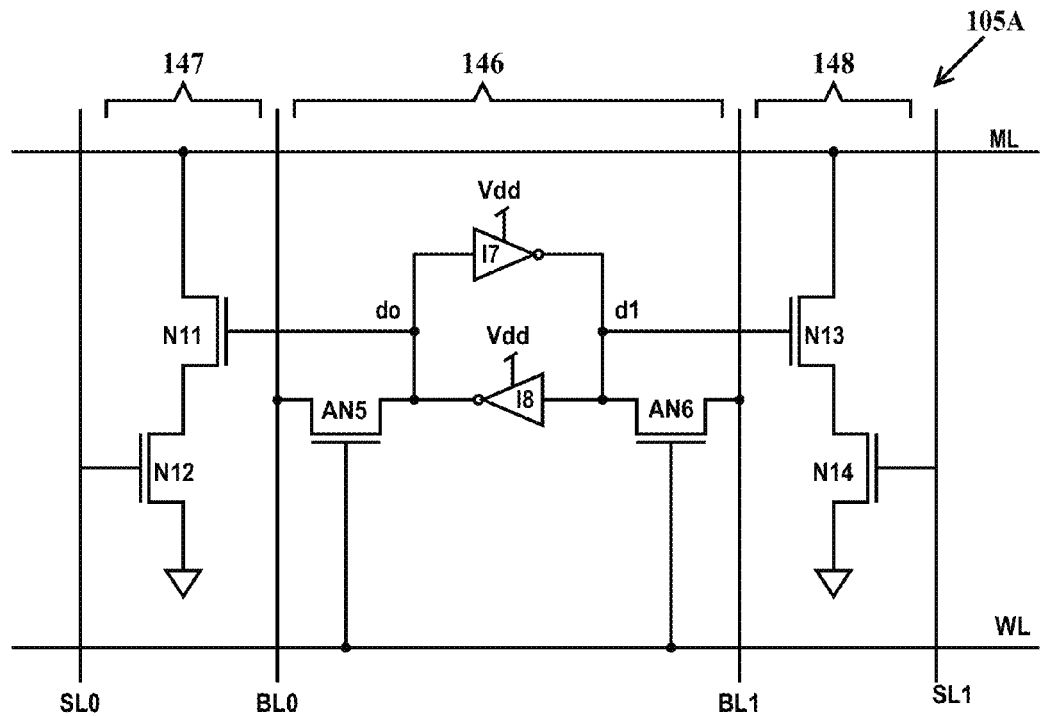
FIG. 6 is a schematic diagram of an exemplary binary CAM cell according to embodiments of the present invention.

FIG. 6 is a schematic diagram of an exemplary binary CAM cell according to embodiments of the present invention. In FIG. 6 a CAM cell 105A includes a static random access memory (SRAM) cell 146 including cross-coupled invertors I7 and I8 and NFETs AN5 and AN6, a first NOR pull-down stack 147 including NFETs N11 and N12, and a second NOR pull-down stack 148 including NFETs N13 and N14. There a single wordline WL, a single matchline M1, a search line pair SL0 and SL1 and a bitline pair BL0 and BL1. CAM cell 105A may be substituted for TCAM cell 105.

The source of NFET N12 is connected to ground, the drain of NFET N11 is connected to the source of NFET N12, the drain of NFET N11 is connected to matchline ML, the gate of NFET N12 is connected to search line SL0 and the gate of NFET N11 is connected to the input of inverter I7 and the output of inverter I8. The output of inverter I8 is connected to input of inverter I7 and the output of inverter I7 is connected to the input of inverter I8. The source of NFET AN5 is connected to bitline BL0, the drain of NFET AN5 is connected to the input of inverter I7 and output of inverter I8, and the gate of NFET AN5 is connected to WL. The source of NFET AN6 is connected to bitline BL1, the drain of NFET AN6 is connected to the input of inverter I8 and the output of inverter I7, and the gate of NFET AN6 is connected to WL.

The Vdd supply to inverters I7 and I8 depends on whether CAM cell 105A is a pre-search CAM cell or a main-search CAM cell. When CAM cell 105A is a pre-search CAM cell, matchline ML is a PML and Vdd is the normal operating power supply Vdd1 of the CAM cell. When CAM cell 105A is a main-search CAM cell, matchline ML is a MML and Vdd is VCS supplied by the light-sleep power circuit 125 described supra in reference to FIG. 1 and FIG. 3.

Read and writes of the SRAM cells occur when the wordline WL to TCAM cell 105A is high (logical 1) and the bit stored in the SRAM is written from or read to the bitlines through NFETs AN5 and AN6.

During a search, the wordline WL is held low (logical 0) and NFETs AN5 and AN6 are turned off. If there is a 1-bit on SL0 NFET N12 is turned on and if there is a 1-bit stored in SRAM cell 161 NFET N11 is turned on and matchline ML is held or pulled to ground. If there is a 0-bit on SL0 NFET N11 is turned off and there is no effect on matchline ML. If there is a 1-bit on SL1 NFET N13 is turned on and if there is a 1-bit stored in SRAM cell 161 NFET N13 is turned on and matchline ML is held or pulled to ground. If there is a 0-bit on SL1 NFET N14 is turned off and there is no effect on matchline ML. The logic function for CAM cell 105A is illustrated in Table II.

TABLE II

| SL0 | SL1 | T |
|-----|-----|---|
| 0   | 1   | 0 |
| 1   | 0   | 1 |

FIG. 7 is a schematic diagram of an exemplary CAM application circuit 150 according to embodiments of the present invention. In FIG. 7, a CAM array 100A includes either TCAM cells 105 or CAM cells 105A arranged as in FIG. 1. There are n+1 pairs of search lines SLX and SLY and m+1 pairs of match result lines (MRL). The 2*(N+1) outputs of search data register/driver 155 are connected to respective n+1 pairs of search lines and an n+1-bit search word signal (SEARCH_DATA_IN) is applied to the input of CAM array 100A. The m+1 MRLs are connected to the m+1 inputs of address encoder 160 and an ADDRESS_OUT signal is generated on the output of address encoder 160. Circuit 150 may be used in such applications as data packet routing, pattern recognition and in microprocessor caches.

Figure 8:
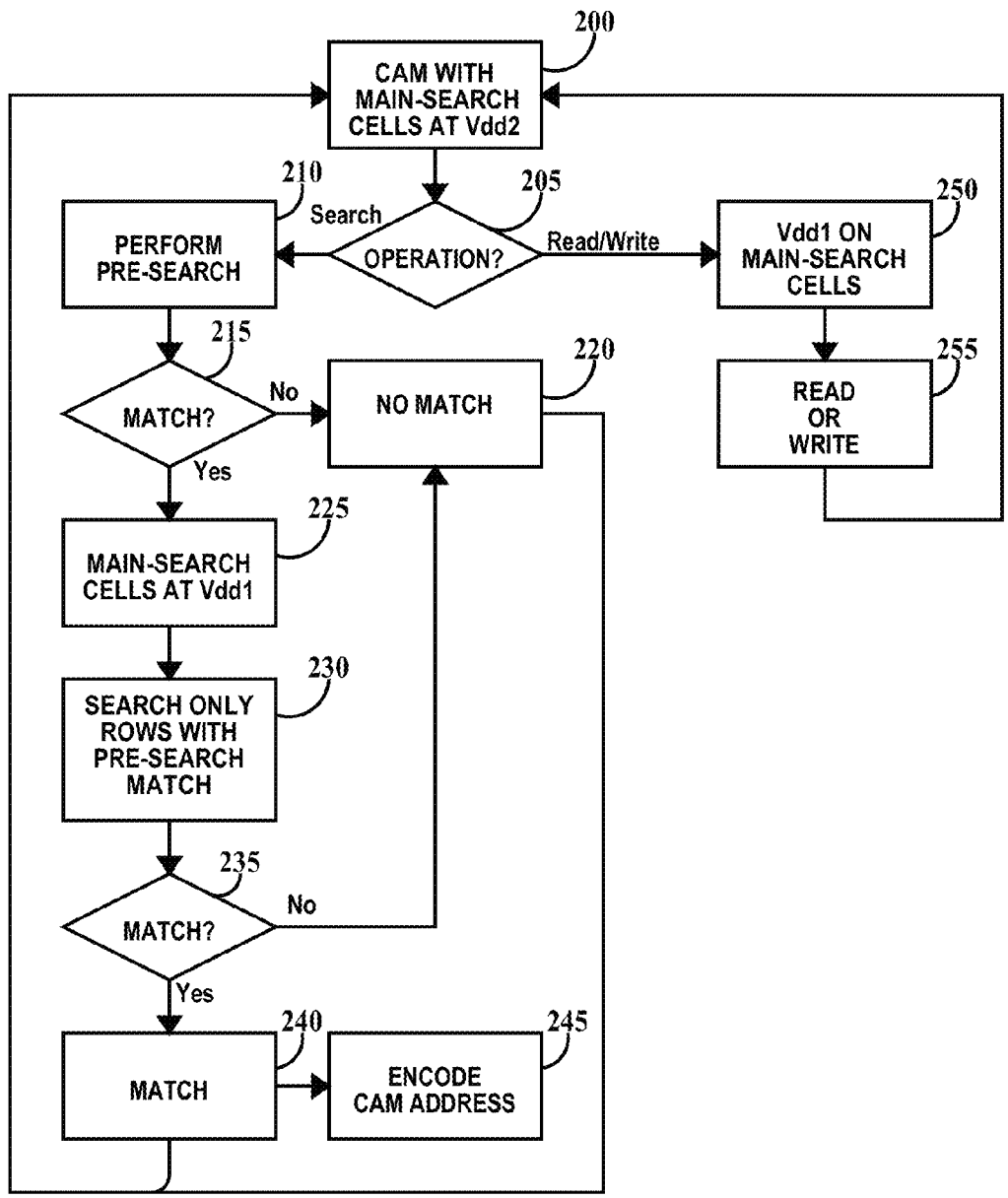
FIG. 8 is a flowchart of a method of searching content addressable memory according to embodiments of the present invention.

FIG. 8 is a flowchart of a method of searching content addressable memory according to embodiments of the present invention. Steps 210 through 245 are performed for each row of CAM cells in the CAM simultaneously as modified by the pre-search and main-search results. In step 200, the CAM cells of the pre-search section are at Vdd1 and the content addressable memory cells of the main-search section are at Vdd1. In step 205, it is determined of a reads/write or search operation is performed. If a search operation is to be performed, the method proceeds to step 210. In step 210, a pre-search word comprising a set of pre-search bits and main-search bits is applied to the CAM and a pre-search of each row of CAM cells of the pre-search section is performed using said set of pre-search bits. In step 215, if a pre-match does not result, then a no match signal is generated in step 220 and the method loops back to step 200. If a match results, the voltage on the CAM cells of the main search section is changed from Vdd2 to Vdd1. In step 230, a main-search of the CAM cells of the main search section is performed. In step 235, it is determined if there is a match. If main-match does not result, then the method proceeds to step 220. If a main-match results, the method proceeds to step 240 and then loops back to step 200. In step 240, a match signal is generated and in step 245 the address of the matching row (matchline) is encoded. Returning to step 205, if a read/write is to be performed, in step 250, the voltage on the CAM cells of the main search section is changed from Vdd2 to Vdd1. Next in step 255, the read/write is performed and the method loops back to step 200. Upon any loop back to step 200 the voltage on the main-search CAM cells is reset to Vdd2.

Thus, the embodiments of the present invention provide CAMs and TCAMs that are power efficient.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A content addressable memory, comprising:
an array of content addressable memory cells arranged in rows and columns and partitioned into a pre-search section and a main-search section; and
each row of content addressable memory cells including:
a row of content addressable memory cells of said pre-search section connected between a first positive voltage rail and ground and connected to a pre-matchline of said content addressable memory;
a corresponding row of content addressable memory cells of said main-search section connected to a light-sleep circuit, to ground and to a main-matchline of said content addressable memory, said light-sleep circuit configured to connect content addressable memory cells of said main-search section to a second positive voltage rail in a light-sleep state and to connect content addressable memory cells of said corresponding row of content addressable memory cells of said main-search section to said first positive voltage rail in an awake state;
a pre-search circuit connected to a pre-search matchline and (i) configured to perform a pre-search of said row of content addressable memory cells of said pre-search section and (ii) configured, only if a match is found, place said light-sleep circuit in said awake state; and
a main-search circuit connected to a main matchline and configured to activate a main-search of said row of content addressable memory cells of said main-search section only if a match is found by said corresponding pre-search circuit.

2. The content addressable memory of claim 1, wherein said light-sleep circuits are configured to place content addressable memory cells of said main-search section in said awake state when a read or write operation is performed to said content addressable memory.

3. The content addressable memory of claim 1, wherein said first positive voltage is greater than said second positive voltage.

4. The content addressable memory of claim 1, wherein content addressable memory cells are ternary content addressable memory cells.

5. The content addressable memory of claim 4, wherein said ternary content addressable memory cells comprise:
a first six cell static random access memory cell connected between a first wordline and a matchline and connected between a first bitline and a second bitline;
a second six cell static random access memory cell connected between a first wordline and said matchline and connected between said first bitline and said second bitline;
a first NOR pull-down stack connected to said first six cell static random access memory cell, said matchline and a first search line; and
a second NOR pull-down stack connected to said second six cell static random access memory cell, said matchline and a second search line.

6. The content addressable memory of claim 1, wherein content addressable memory cells are binary content addressable memory cells.

7. The content addressable memory of claim 6, wherein said binary content addressable memory cells comprise:
a six cell static random access memory cell connected between a wordline and a matchline and connected between a first bitline and a second bitline;
a first NOR pull-down stack connected to said six cell static random access memory cell, said matchline and a first search line; and
a second NOR pull-down stack connected to said six cell static random access memory cell, said matchline and a second search line.

8. The content addressable memory of claim 1, further including:
a search data register/driver connected to search lines of said content addressable memory; and
an address encoder connected to match result lines of said content addressable memory.

9. The content addressable memory of claim 1, wherein said content addressable memory cells of said main-search section include a pair of cross-coupled inverters, PFETs of said invertors connected to a voltage output of said light-sleep circuits and NFETs of said inverters connected to ground.

10. The content addressable memory of claim 1, further including:
a respective latch connected to an output of each of said main-search circuits.

11. A method of searching a content addressable memory, comprising:
providing an array of content addressable memory cells arranged in rows and columns and partitioned into a pre-search section and a main-search section;
applying a first positive voltage to content addressable memory cells of said pre-search section;
applying a second positive voltage to content addressable memory cells of said main-search section, said second voltage lower than said first voltage;
applying a search word comprising a set of pre-search bits and main-search bits to said content addressable memory;
performing a pre-search of each row of content addressable memory cells of said pre-search section using said set of pre-search bits;
only for each row of content addressable memory cells where a match was found as a result of performing said pre-search, de-applying said second voltage and applying said first voltage to said content addressable memory cells of said main-search section and then performing a main-search of those rows of content addressable memory cells of said main-search section using said set of main-search bits;
for each row of content addressable memory cells where no match was found as a result of performing said pre-search or as a result of performing said main-search, generating a no-match signal; and
for each row of content addressable memory cells where a match was found as a result of performing said pre-search and as a result of performing said main-search, generating a match signal.

12. The method of claim 11, further including:
de-applying said second voltage and applying said first voltage to said content addressable memory cells of said main-search section after completion of said main-search.

13. The method of claim 11, further including:
de-applying said second voltage and applying said first voltage to said content addressable memory cells of said main-search section so as to perform a read operation to said content addressable memory at said first voltage or to perform a read operation of said content addressable memory performed or a sequence of read and write operations; and de-applying said first voltage and applying said second voltage to said content addressable memory cells of said main-search section after completion of said read operation or said write operation or said sequence of read and write operations.

14. The method of claim 11, wherein content addressable memory cells are ternary content addressable memory cells.

15. The method of claim 14, wherein said ternary content addressable memory cells comprise:
- a first six cell static random access memory cell connected between a first wordline and a matchline and connected between a first bitline and a second bitline;
- a second six cell static random access memory cell connected between a first wordline and said matchline and connected between said first bitline and said second bitline;
- a first NOR pull-down stack connected to said first six cell static random access memory cell, said matchline and a first search line; and
- a second NOR pull-down stack connected to said second six cell static random access memory cell, said matchline and a second search line.

16. The method of claim 11, wherein content addressable memory cells are binary content addressable memory cells.

17. The method of claim 16, wherein said binary content addressable memory cells comprise:
- a six cell static random access memory cell connected between a wordline and a matchline and connected between a first bitline and a second bitline;
- a first NOR pull-down stack connected to said six cell static random access memory cell, said matchline and a first search line; and
- a second NOR pull-down stack connected to said six cell static random access memory cell, said matchline and a second search line.

18. The method of claim 11, further including:
applying said search word to all rows of said content addressable memory simultaneously; and
encoding the address of each row of said content addressable memory that generated a match signal.

19. The method of claim 11, further including:
latching each match or no match signal.

20. The method of claim 11, wherein:
each row of content addressable memory cells includes:
- a row of content addressable memory cells of said pre-search section connected between a first positive voltage rail and ground and connected to a pre-matchline of said content addressable memory;
- a corresponding row of content addressable memory cells of said main-search section connected to a light-sleep circuit, to ground and to a main-matchline of said content addressable memory of said main-search section, said light-sleep circuit configured to connect content addressable memory cells to a second positive voltage rail in a light-sleep state and to connect content addressable memory cells of said corresponding row of content addressable memory cells of said main-search section to said first positive voltage rail in an awake state;
- a pre-search circuit connected to a pre-search matchline and (i) configured to perform a pre-search of said row of content addressable memory cells of said pre-search section and (ii) configured, only if a match is found, place said light-sleep circuit in said awake state; and
- a main-search circuit connected to a main matchline and configured to activate a main-search of said row of content addressable memory cells of said main-search section only if a match is found by said corresponding pre-search circuit.

21. The method of claim 20, wherein said content addressable memory cells of said main-search section include a pair of cross-coupled inverters, PFETs of said invertors connected to a voltage output of said light-sleep circuits and NFETs of said inverters connected to ground.

* * * * *